United States Patent
Jun et al.

(10) Patent No.: US 8,935,583 B2
(45) Date of Patent: Jan. 13, 2015

(54) REMOVING SCAN CHANNEL LIMITATION ON SEMICONDUCTOR DEVICES

(75) Inventors: Hongshin Jun, San Jose, CA (US); William Eklow, San Jose, CA (US); Sun-Gyu Kim, Pleasanton, CA (US)

(73) Assignee: Cisco Technology, Inc., San Jose, CA (US)

( * ) Notice: Subject to any disclaimer, the term of this patent is extended or adjusted under 35 U.S.C. 154(b) by 249 days.

(21) Appl. No.: 13/477,150

(22) Filed: May 22, 2012

(65) Prior Publication Data

US 2013/0318410 A1    Nov. 28, 2013

(51) Int. Cl.
*G01R 31/28* (2006.01)

(52) U.S. Cl.
USPC .......................................... 714/726; 714/738

(58) Field of Classification Search
CPC ................ G01R 31/318536; G01R 31/318541
USPC .................... 714/726, 738, 731, 724
See application file for complete search history.

(56) References Cited

U.S. PATENT DOCUMENTS 6,658,613 B2 * 12/2003 Rearick et al. ................ 714/724
6,859,902 B1 * 2/2005 Dalal et al. .................... 714/726
7,043,674 B2 * 5/2006 Rearick et al. ................ 714/724
7,447,963 B2 * 11/2008 Schuttert ........................ 714/731
8,136,082 B2 * 3/2012 Desineni et al. ............... 716/136

OTHER PUBLICATIONS

Eklow, et al., "IEEE 1149.6: A Boundary-Scan Standard for Advanced Digital Networks," IEEE Design & Test of Computers, Sep.-Oct. 2003, pp. 77-83.
Eklow, et al., "IEEE 1149.6—A Practical Perspective," Proceedings of the 2003 International Test Conference, Sep.-Oct. 2003, pp. 494-502.

* cited by examiner

*Primary Examiner* — Fritz Alphonse
(74) *Attorney, Agent, or Firm* — Edell, Shapiro & Finnan, LLC

(57) ABSTRACT

A method to perform component testing by supplying test patterns to a serial input pin coupled to an IEEE 1149.6 boundary-scan cell that is associated with an IEEE 1149.6 test receiver. The test receiver is configured to operate in a scan test mode. The output from the test receiver circuit is coupled to a logic block to be scan tested. The output from the logic block is coupled to a serial output pin on the integrated circuit during scan test mode. High performance integrated circuits can use SerDes pins in a scan test mode to be scan tested without impacting mission critical signals.

20 Claims, 5 Drawing Sheets

| ASIC | # SCAN CHANNELS (CONVENTIONAL) | SERDES CHANNELS | # SCAN CHANNELS (PROPOSED) | TEST TIME* (CONV) | TEST TIME* (PROP) | TEST TIME REDUCTION |
|---|---|---|---|---|---|---|
| CHIP 1 | 256 | 64 | 384 | 1.0 | 0.67 | 1.5x |
| CHIP 2 | 146 | 120 | 386 | 1.75 | 0.67 | 2.6x |
| CHIP 3 | 85 | 624 | 709 | 3.0 | 0.36 | 8.3x |
| CHIP 4 | 28 | 37 | 102 | | | 3.6x |

FIG.3

REMOVING SCAN CHANNEL LIMITATION ON SEMICONDUCTOR DEVICES

TECHNICAL FIELD

The present disclosure relates to component testing of different integrated circuits, board circuits and digital networks by removing scan channel limitations in high-speed components.

BACKGROUND

Semiconductors today have millions of logic gates on the device. As transistor and semiconductor technology is evolves, the number of logic gates on the device will increase. It is important to test all of the logic gates on a device in a reasonable period of time, and this will become more challenging for newer generation semiconductor devices.

In semiconductor test methodologies, Automatic Test Pattern Generation (ATPG) and scan test are the two most commonly used techniques for testing logic gates on a semiconductor device. The scan test volume (the amount of data required to program the scan test) is increasing as technology scaling increases the number of gates on the device. More test patterns (data) are also required to detect more subtle defects which also result from technology scaling. These factors require significantly more test patterns to detect small delay defects, N-detects and bridging faults simply to achieve the quality target. Additionally, ATPG is becoming more constrained by power requirements during shift and capture cycles, which also results in more test patterns. When the compression ratio stays flat, ATPG testing does not scale.

Scan testing is facing its own challenges. The number of scan channels available on a given semiconductor device is fewer on newer devices, but the test data volume is increasing with the number of logic gates to be tested. Most of the pins on a semiconductor device are serial input or output pins. At high speed and/or for high performance semiconductor devices, the serial input and output pins are connected to Serializer-Deserializer (SerDes) interfaces. The available pins for scan testing are limited to the lower speed "digital pins". SerDes pins cannot be used for scan testing because even a single fan-out from the high speed signals for scan channels would affect system integrity and cause performance degradation. Using a conservative approach, the design engineers would not allow test engineers to add circuitry for scan connections.

Scan test time is an important factor in component cost and the ability to deliver large numbers of components in a timely manner. Scan data compression techniques known in the industry have been successful in reducing the scan test time but do not help when the compression ratio stays flat around 50× and do not scale when the number of scan channels available are reduced. In the case described above, fewer test channels mean longer test times, higher costs and reduced ability to deliver parts on time.

BRIEF DESCRIPTION OF THE DRAWINGS

FIG. 3 is a table of test time estimations collected when testing different high performance devices, and test time reduction by including SerDes channels as scan channels.

DESCRIPTION OF EXAMPLE EMBODIMENTS

Overview

Techniques are provided for testing components, e.g., digital logic gates on an integrated circuit. A test pattern is supplied to a serial input pin on an integrated circuit to be tested. The serial pin is coupled to a boundary-scan cell that is associated with a test receiver (on the integrated circuit). The test receiver is configured to operate in a scan test mode. The output of the test receiver is coupled during the scan test mode to a logic block to be tested on the integrated circuit. A method is also provided herein that involves operating an integrated circuit in a scan test mode and receiving scan test data output from scan chain logic at a scan test multiplexer. The output of the scan chain logic is selected with the scan test multiplexer. The scan test data is then output through a serial pin when the scan test multiplexer is configured in the scan test mode.

Example Embodiments

Semiconductor devices have serial input and output pins. High performance Application Specific Integrated Circuits (ASICs) have numerous SerDes pins. The SerDes interface is used for component testing by enabling a scan test mode on the SerDes interface. By using SerDes interface and existing circuitry already available on the SerDes interface, test time can be drastically reduced.

The IEEE 1149.6 standard is a standard to test AC-coupled interconnections between devices on boards. Most SerDes interfaces support this standard. The IEEE 1149.6 Test Receivers on SerDes interfaces are used to provide scan channels. The boundary scan cells with Test Receivers are associated with different serial input and output pins. The operation of the boundary scan cells is in accordance with standards compatible with boundary scan testing industry standards. The test receiver and scan chain logic form a test path in the integrated circuit that is configured to operate in accordance with boundary scan testing industry standards. Different test patterns can be provided to these SerDes interfaces that have a scan test enable mode and millions of gates coupled in the digital logic can be tested. Both a scan test pattern as well as a non-scan test pattern can be provided as an input to the SerDes interface pins in scan test mode. The SerDes pins are used without causing mission mode signal integrity issues. The scan test mode using the SerDes pins functions well with regular scan testing as well as compression scan testing techniques.

The testing techniques described herein use/borrow a test receiver that is part of the hardware that enables the Joint Test Action Group (JTAG) testing, but do not use the IEEE 1149.6 boundary-scan test methodology itself.

Figure 1:
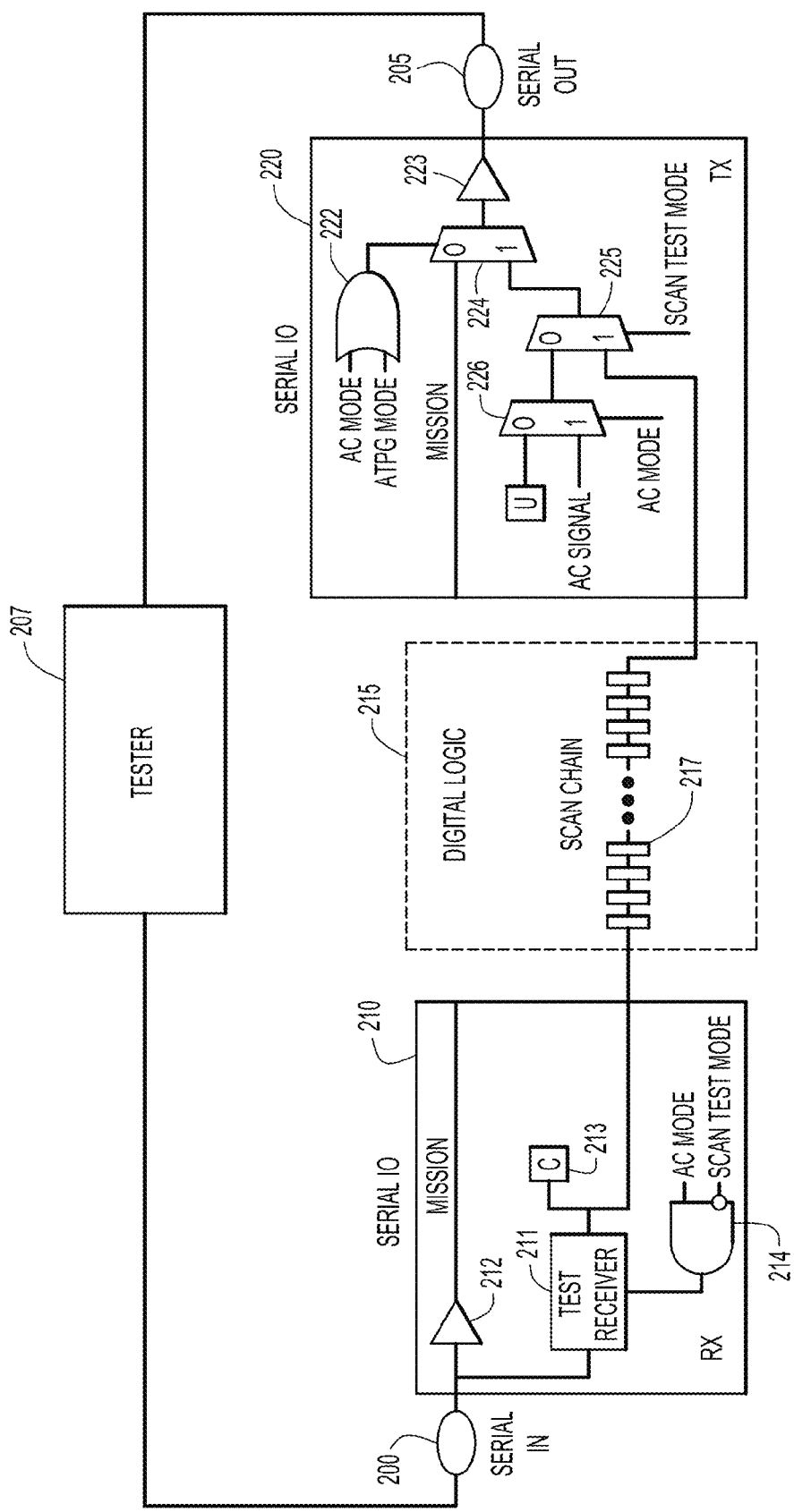
FIG. 1 is a block diagram showing an example of a single serial input pin coupled to a serial output pin used to test digital logic blocks that are coupled between the input and output pins.

Referring to FIG. 1, a schematic diagram is shown of the circuitry configured to enable the test capabilities in an integrated circuit device. A serial input pin (Serial In) 200 and a serial output pin (Serial Out) 205 are shown functioning in a scan test mode. A receive (RX) serial IO block 210 is coupled to digital logic 215 that includes a scan test chain 217 that needs to be tested on an integrated circuit. The digital logic 215 is also coupled to a transmit (TX) serial TO block 220. The serial input pin 200 is coupled to the RX serial TO block 210 and the serial output pin 205 is coupled to the TX serial TO block 220. A tester device 207 connects to the serial input pin 200 and the serial output pin 205. The tester device 207 transmits test data to the serial input pin 200 and receives test (response) data from the serial output pin 205.

The serial input pin 200 receives different test patterns in scan test mode. When not in scan test mode, the serial input pin 200 performs the regular functions of receiving serial data.

The RX serial TO block 210 comprises a Test Receiver 211, a buffer 212, a connection 213 at the output of the Test Receiver 211 and a gate 214. The connection 213 is made to the Test Receiver 211. The gate 214 has an input labeled Scan Test Mode that configures the Test Receiver 211 to receive scan test data. There is also an input to the gate 214 labeled AC mode. 'AC Mode' and 'Scan Test Mode' are control signals from a JTAG Tap controller.

Similarly, the TX serial TO block 220 comprises an OR gate 222, an output buffer 223, and selectors/multiplexers 224, 225 and 226. The multiplexer 225 selects the test scan chain 217 as an output signal when the Scan Test Mode is enabled.

The Test Receiver 211 in the RX serial TO block 210 can be configured in to operate in the Scan Test Mode. When the Scan Test Mode is enabled, the test pattern data received at the serial input pin 200 bypasses the mission circuit (associated with buffer 212) and goes through the Test Receiver 211 that is coupled by connection 213 to the digital logic 215 that is to be tested.

When the Scan Test Mode is enabled, the Test Receiver 211 output goes to the digital logic 215 and is received by the TX serial TO block 220. The multiplexer 225 in the TX serial TO block 220 is enabled when the Scan Test Mode is enabled. When the Scan Test Mode is not enabled, the multiplexers 224, 225 and 226 operate so as to permit the AC mode for AC signal testing or mission mode for mission operation. The serial out pin 205 receives the output of the test pattern that has passed through the digital logic 215. The output test pattern signal is then processed (by test equipment or other means, not shown) to evaluate performance and operation of the digital logic 215. Thus, the test pattern data is passed through the logic block 215 and received as scan test data output from the logic block 215 at the scan test multiplexer 225. When in scan test mode, the output from the scan test multiplexer 225 coming from the logic block 215 is selected and is sent as output through the serial output pin 205. Techniques are known for evaluating/analyzing the test pattern output data, and are therefore not described herein.

Thus, as explained above, an integrated circuit is operated in scan test mode. The scan test data output is received at the serial output side after passing through the scan chain logic at a scan test multiplexer 225. The scan test multiplexer 225 is enabled when the integrated circuit is configured in scan test mode. When the scan test multiplexer output is enabled in scan test mode, the scan test data is output through the serial output pin. The scan test data passing through the logic blocks is collected at the serial output side by coupling to the serial output pin. The Test Receiver 211 and scan chain logic 217 do not violate boundary-scan testing industry standards.

The mission signals are critical signals running at relatively high speeds, e.g., 10 Gbps. However, the Test Receiver signals are not timing critical. They are typically running below 100 MHz. The normal operational mode of the SerDes pins is not affected because the test circuitry is disabled during normal operational mode. During test mode, the test circuitry may run at a lower speed but the overall performance of the circuit is not impacted. Thus, component testing can be performed utilizing boundary-scan test features which are otherwise used for board and system testing.

Figure 2:
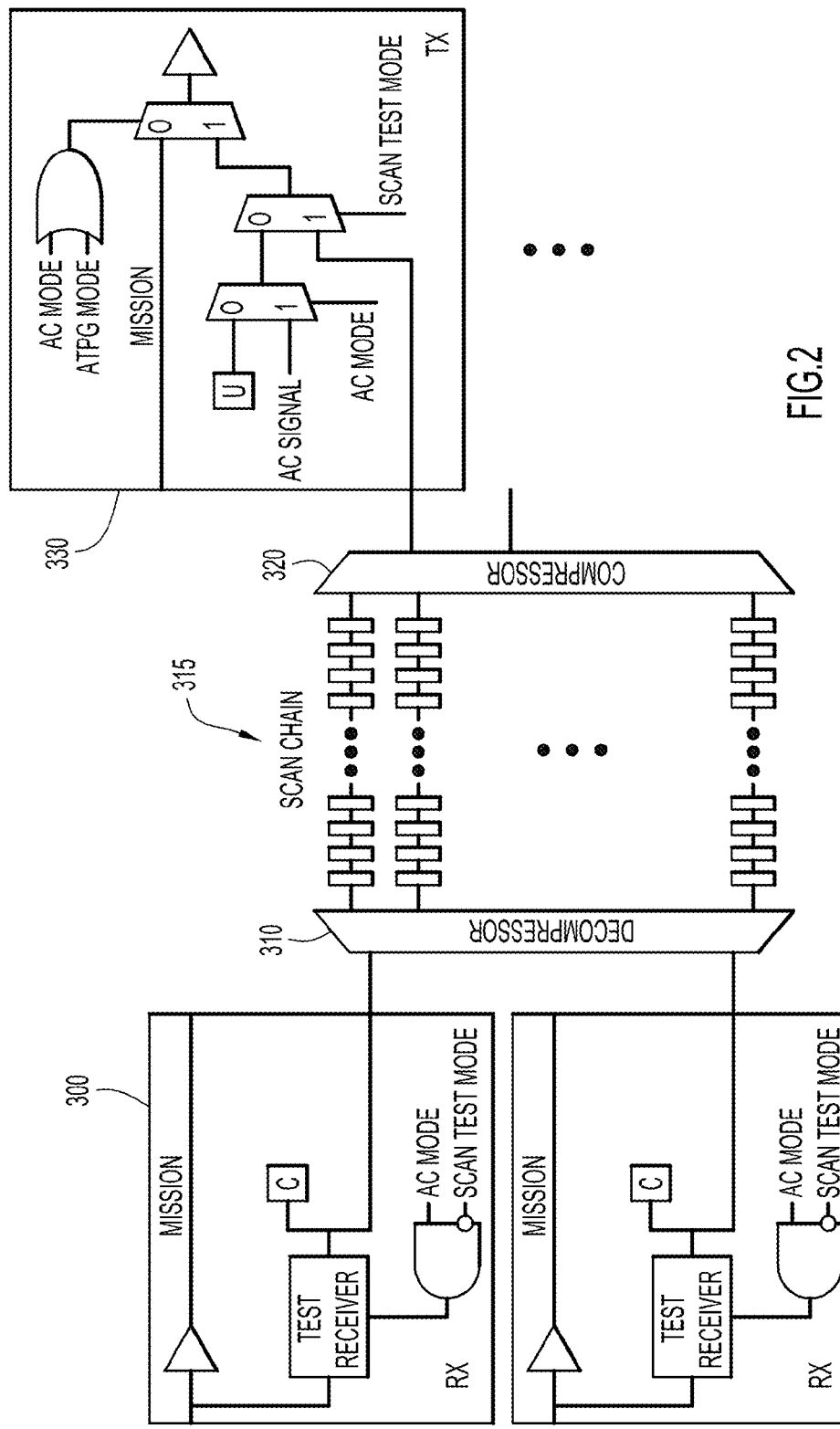
FIG. 2 is a block diagram showing a scan test example across a plurality of serial pins connected through a compressor block and decompressor block.

FIG. 2 shows the use of compression techniques for scan channel testing using the Scan Test Mode. The serial input side has one or more serial input pins coupled to a corresponding RX serial IO block 300. Each RX serial IO block pin is associated with a boundary scan cell that has the Test Receiver that can operate in Scan Test Mode, as described above in connection with FIG. 1. Thus, each of the RX serial IO blocks 300 has components the same as that for RX serial IO block 210 shown in FIG. 1. The outputs of the Test Receivers are coupled to a decompressor block 310. The decompressor block 310 is coupled to the digital logic 315 that comprises a plurality of scan chains to be tested. Each scan chain is then coupled to a compressor block 320. The output from the compressor block 320 is coupled to TX serial IO blocks 330, each of which is coupled to a serial output pins as shown in FIG. 1. Each of the RX serial IO blocks 320 has components the same as that for TX serial IO block 220 shown in FIG. 1. Thus, multiple serial input pins coupled to associated test receivers distribute scan test data to a plurality of logic blocks in the integrated circuit. The scan test data is collected from the plurality of logic blocks and coupled to multiple serial output pins. Thus, the RX serial IO blocks 300 and the TX serial IO blocks 330 are the same as the similarly named IO blocks in FIG. 1. Thus, these blocks operate in the same manner as described above in connection with FIG. 1. The test pattern data received from the serial input pins is compressed test pattern data that has wider coverage of the digital logic to be tested. In other words, the number of scan chains in the digital logic 315 that are tested exceeds the number of serial input pins and serial output pins. A tester device may be connected to the plurality of serial pins on the integrated circuit and is used to supply a test pattern to each of the plurality of serial pins on the integrated circuit.

FIG. 3 illustrates a table showing test times for different circuits in different types of semiconductor devices based on number of scan channels available. The test volume is assumed to be same for all the devices. The columns labeled "#Scan Channels (Proposed)" and "Test Time (Prop)" indicate the relevant data when the techniques described herein are employed, as opposed to the conventional techniques. As can be seen there is a significant reduction in test time using the Scan Test Mode enabled on SerDes pins, as described above in connection with FIGS. 1 and 2.

Figure 4:
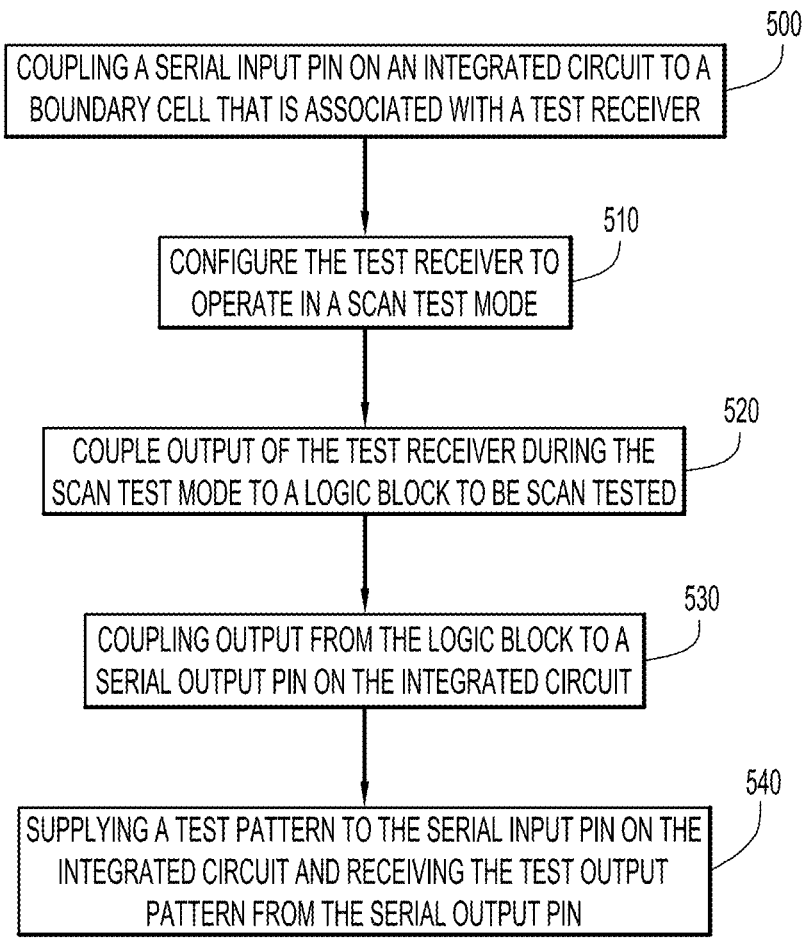
FIG. 4 shows a flow chart depicting the component testing techniques using a scan test method as described herein.

Reference now is made to FIG. 4 that illustrates a flow chart showing the steps involved in the Scan Test Mode over serial input and output pins. At 500, a serial input pin on an integrated circuit is coupled to a boundary cell that is associated with a test receiver. At 510, the test receiver is configured to operate in a Scan Test Mode. At 520, the output of the test receiver is coupled to a digital logic block that is to be scan tested. At 530, the logic block to be tested is coupled to a serial output pin in the integrated circuit. At 540, a test pattern data signal is supplied to the serial input pin on the integrated circuit and the test pattern output signal is received from the serial output pin. The test pattern output signal may then be analyzed to detect different types of defects in the digital logic block.

The advantages of using the SerDes pins for scan channel testing are numerous. There is a reduction in the test time using Automatic Test Equipment (ATE) to test an integrated circuit device. A reduction in the test time results in lower cost products. The scan test method using SerDes pins gives an improved utilization of ATE vector memory allowing bandwidth for additional vectors and improved coverage in testing logic gates. Overall, the test time and the test equipment cost are significantly reduced. The unique use of the test receiver as described herein is much more simplified compared to other approaches that go directly through the SerDes infrastructure, requiring much more significant effort to couple to the scan chains.

Figure 5:
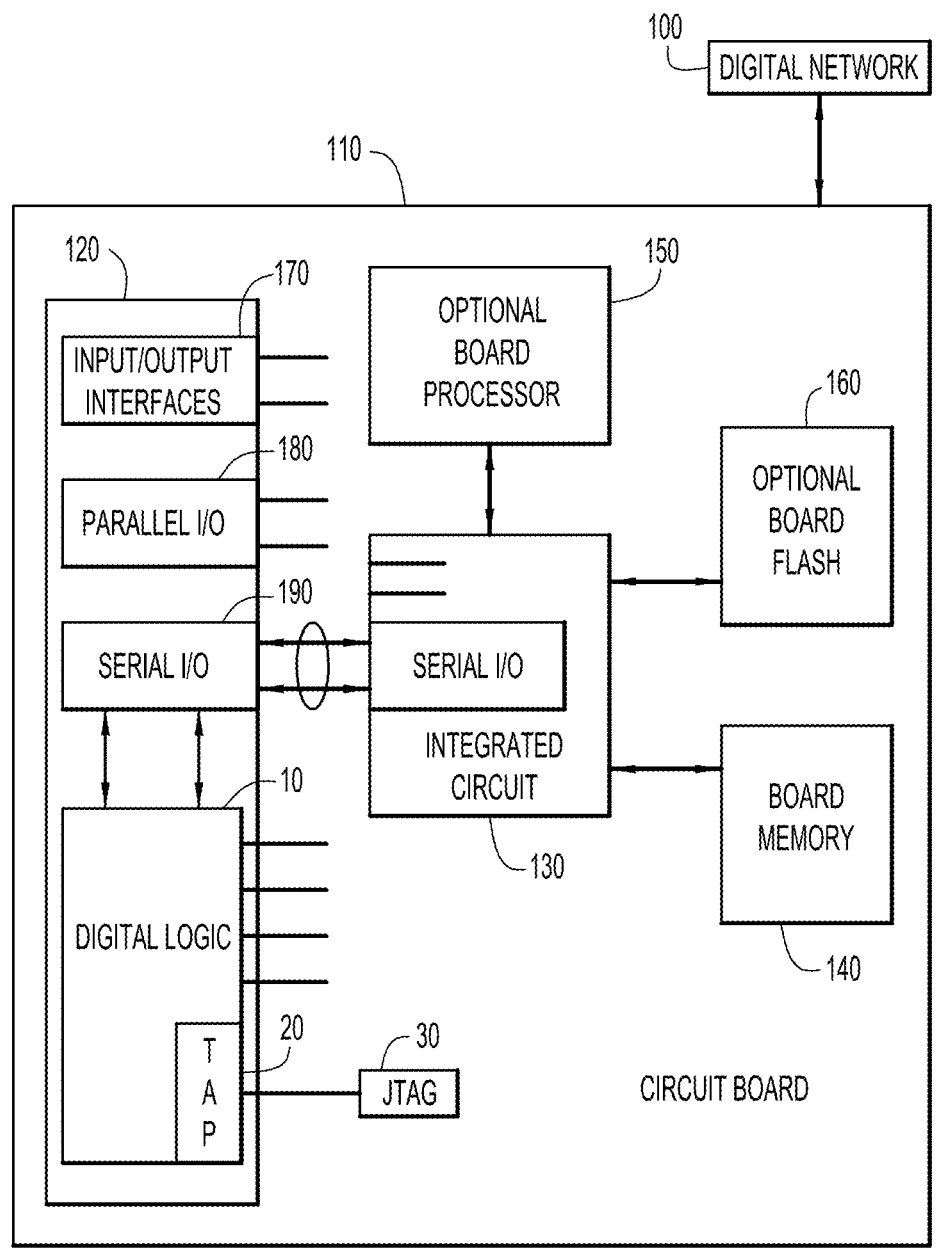
FIG. 5 is a block diagram showing an example of a circuit board that includes serial input/output that may be used for component testing using the techniques described herein.

Referring now to FIG. 5, an example circuit board 110 is shown coupled to a digital network 100. The circuit board 110 has different components including an interface block 120 that designates different types of interfaces, one or more integrated circuits 130 and one or more board memories 140. An onboard processor 150 is also provided, though it may be optional for certain applications. The scan test mode is useful to test digital logic with or without processors. Flash memory 160 is optional as well.

The interface block 120 has different interfaces including input/output interfaces 170, parallel input/output interfaces 180 and high performance (speed) serial input/output interfaces 190. The high performance serial input/output interfaces 190 are also known as SerDes interfaces. Digital Logic 10 connects the serial input/output pins 190 to the Joint Test Action Group (JTAG) interface 30 via a Tap connector 20. As explained above, the Test Receiver (FIG. 1) is part of the hardware that enables the JTAG testing. For purposes of this description, the term JTAG refers to any of the IEEE boundary-scan standards which are based on the IEEE 1149.1 standard, including the IEEE 1149.6 standard specifically referred to herein.

The scan test mode enabled on the serial input/output pins 190 can be used to test integrated circuits, circuit boards and digital circuit networks. The techniques described herein are applicable for boundary scan testing of one or more integrated circuits, board circuit or digital networks. FIG. 5 shows an example in which a circuit board can be tested with tester equipment after production, as well as in production.

The above description is intended by way of example only.

What is claimed is:

1. A method to perform component testing, the method comprising:
   supplying a test pattern to a serial input pin on an integrated circuit, the serial input pin being coupled to a boundary-scan cell that is associated with a test receiver;
   configuring the test receiver to operate in a scan test mode;
   coupling output of the test receiver during the scan test mode to a logic block to be scan tested; and
   coupling output from the logic block to a serial output pin on the integrated circuit via a scan test multiplexer when the scan test multiplexer selects the scan test mode.

2. The method of claim 1, wherein coupling the output from the logic block comprises:
   coupling the output from the logic block to the serial output pin on the integrated circuit during the scan test mode.

3. The method of claim 2, wherein coupling the output from the logic block to the serial output pin comprises:
   receiving scan test data output from the logic block at the scan test multiplexer;
   selecting the output from the logic block with the scan test multiplexer; and
   outputting the scan test data through the serial output pin when the scan test multiplexer selects the scan test mode.

4. The method of claim 1, further comprising:
   distributing the output of the test receiver to a plurality of logic blocks in the integrated circuit; and
   collecting scan test data from the plurality of logic blocks for coupling to the serial output pin.

5. The method of claim 4, and further comprising connecting a tester device to a plurality of serial pins on the integrated circuit, and wherein supplying comprises supplying a test pattern to each of the plurality of serial pins on the integrated circuit.

6. The method of claim 1, wherein the serial input and output pins are SerDes input and output pins.

7. The method of claim 1, wherein coupling the output of the test receiver comprises coupling the output of the test receiver during the scan test mode to scan chain logic.

8. The method of claim 1, wherein the test receiver and scan chain logic form a test path in the integrated circuit that is configured to operate in conjunction with boundary-scan testing industry standards.

9. The method of claim 1, further comprising performing component testing utilizing boundary-scan test features which are otherwise used for board and system testing.

10. A method to perform component testing, the method comprising:
    operating an integrated circuit in a scan test mode;
    receiving scan test data output from scan chain logic at a scan test multiplexer;
    selecting the output from the scan chain logic with the scan test multiplexer; and
    outputting the scan test data through a serial pin when the scan test multiplexer is configured in the scan test mode.

11. The method of claim 10, further comprising:
    collecting scan test data from a plurality of logic blocks for coupling to the serial pin.

12. The method of claim 10, further comprising connecting a tester device to a plurality of serial pins on the integrated circuit, transmitting test data from the tester device to the serial pins, and outputting scan test data from each of the plurality of serial pins on the integrated circuit to the tester device.

13. The method of claim 10, wherein the serial pin is the SerDes pin.

14. The method of claim 10, further comprising performing component testing utilizing boundary-scan test features which are otherwise used for board and system testing.

15. An apparatus for component testing of an integrated circuit, comprising:
    a test receiver circuit having an input coupled to a serial input pin on the integrated circuit and an output coupled to a logic block to be tested, wherein the test receiver circuit operates in a scan test mode; and
    a multiplexer circuit to receive scan test mode output from the logic block and to couple the scan test mode output to a serial output pin on the integrated circuit.

16. The apparatus of claim 15, and further comprising:
    a decompressor circuit to distribute the output of the test receiver to a plurality of logic blocks in the integrated circuit; and
    a compressor circuit to collect scan test mode outputs from the plurality of logic blocks for coupling to the serial output pin.

17. The apparatus of claim 15, wherein the serial input and output pins are SerDes pins.

18. The apparatus of claim 15, wherein the test receiver and scan chain logic form a test path in the integrated circuit that is configured to operate in conjunction with boundary scan testing industry standards.

19. The apparatus of claim 15, wherein the logic block is a scan chain.

20. The apparatus of claim 15, wherein the test receiver circuit is configured to perform boundary scan testing of one or more integrated circuits, board circuit or digital networks.

* * * * *